Figure 1:
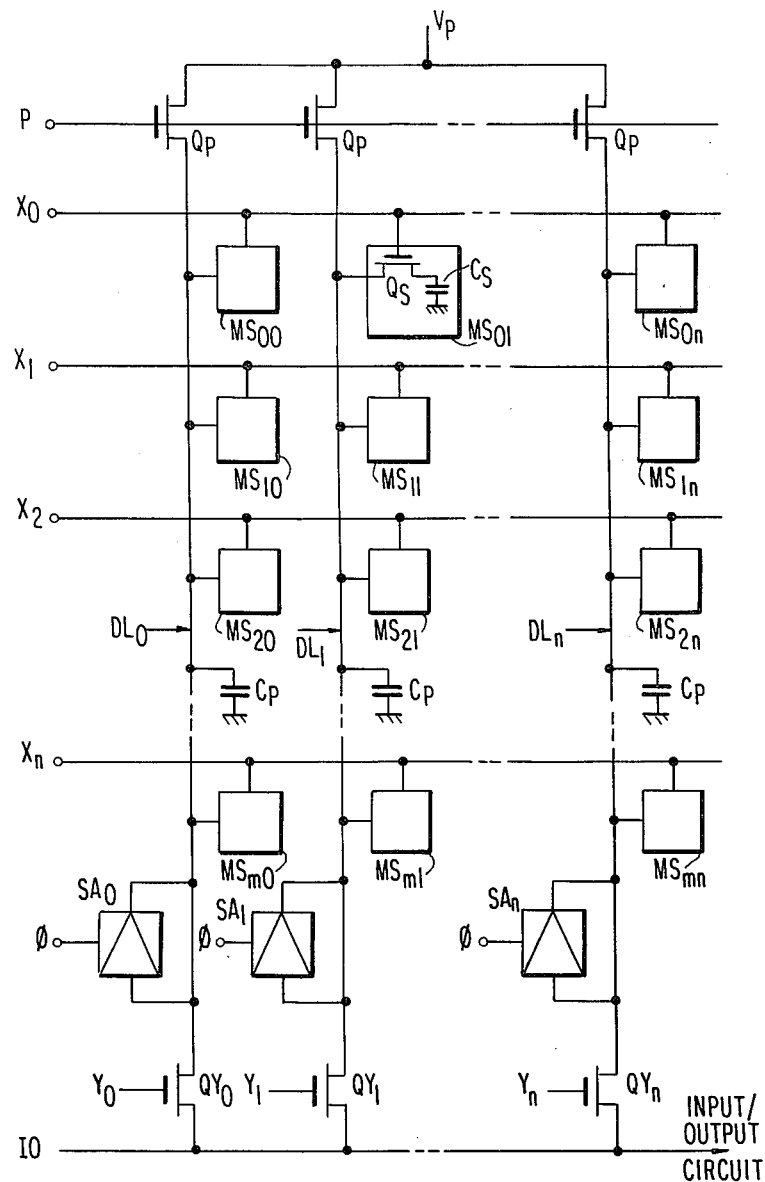

United States Patent [19]

Takamatsu

[11] 4,439,843
[45] Mar. 27, 1984

[54] MEMORY DEVICE
[75] Inventor: Ryoichi Takamatsu, Tokyo, Japan
[73] Assignee: Nippon Electric Co., Ltd., Tokyo, Japan
[21] Appl. No.: 322,131
[22] Filed: Nov. 17, 1981
[30] Foreign Application Priority Data
Nov. 17, 1980 [JP] Japan .................. 55-161519
[51] Int. Cl.³ .............................. G11C 7/00
[52] U.S. Cl. .................................. 365/218
[58] Field of Search ......................... 365/218
[56] References Cited
U.S. PATENT DOCUMENTS
4,247,918 1/1981 Iwahashi et al. ................ 365/218

OTHER PUBLICATIONS
IBM Technical Disclosure Bulletin, vol. 20, No. 5, Oct. 1977, pp. 1716–1717, Block Erase for One-Device Cell Memory Arrays, Gray et al.

Primary Examiner—George G. Stellar
Attorney, Agent, or Firm—Sughrue, Mion, Zinn, Macpeak and Seas

[57] ABSTRACT

A memory device having initial set function for setting contents of memory cells at a predetermined state prior to data processing comprises a plurality of memory cells, at least one sense amplifier, at least one data line coupled between the sense amplifier and the memory cells and means for forcibly setting an output potential of the sense amplifier at a predetermined logic level.

14 Claims, 9 Drawing Figures

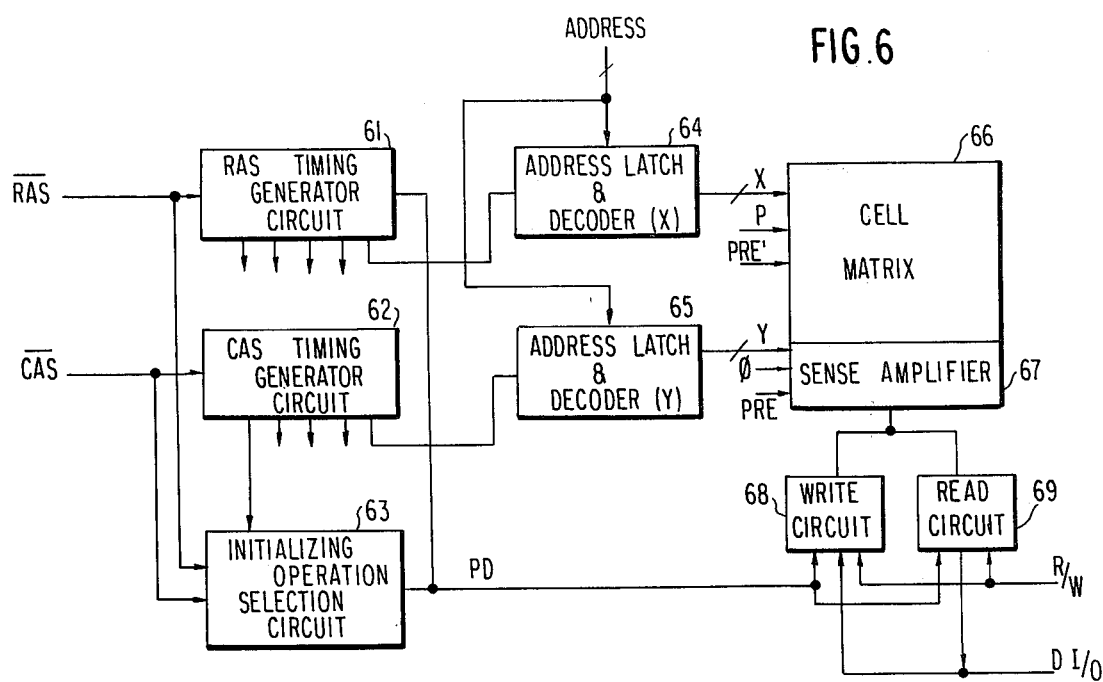
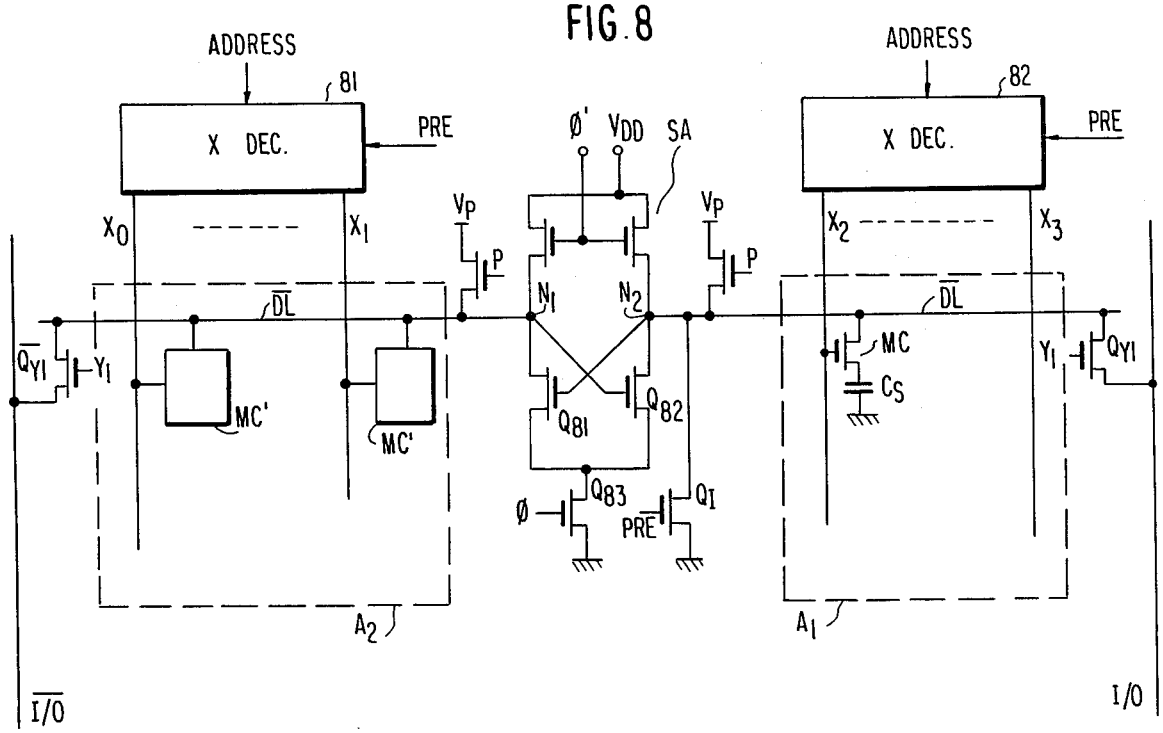

MEMORY DEVICE

The present invention relates to a memory device, and more particularly to a memory device which can be realized as an integrated circuit (IC), that is, an integrated circuit memory device.

The integrated circuit memory device (hereinafter abbreviated as "memory") has been widely utilized as a high-speed large-capacity memory device. A memory is formed of a plurality of memory cells each storing binary information. In such memory cells, after supply of a power supply to a memory on after predetermined information processing, the memory contents are in a random condition, and when the memory cells under such condition are used for new information processing, an operation for unifying the memory contents in all the memory cells into the same, that is, for bringing them into an initial condition, is necessitated. Heretofore, in the case of unifying all the memory cell contents in a memory into the same logic state (for instance, all into logic "1" or all into "0"), that is, in the case of initial set, it can be achieved by successively writing the same data through normal write processing over the all addresses. Also another system can be conceived in which same data are stored in all the memory cells by discharging capacitors which serve as memory means in the respective memory cells as is the case with a dynamic type memory. However, in this case, it is necessary to leave the memory device as it is until the charge on the capacitors in all the memory cells is naturally discharged to the same level. While, according to the former method, as a result of enlargement of a capacity of a memory, the time required for initial set becomes very long because it is equal to a time necessitated for writing one datum multiplied by the number of memory cells. On the other hand, though the latter method is theoretically possible, in practice the discharge time of the capacitor in each memory cell within one memory is very long and moreover different for individual capacitors, and in the longest case there is even a memory cell having a discharge time of 10 seconds or more. Consequently, the preparation time for initial set is long, and the method cannot be practical.

It is therefore one object of the present invention to provide a memory device having an initial set function in which the contents of all the memory cells or of the memory cells in a predetermined region within the memory device can be unified in a short period of time with a simple structure.

The memory device according to the present invention comprises a plurality of address lines (row selection lines), a plurality of data lines, memory cells disposed at intersections between the address lines and data lines, a plurality of sense amplifiers provided respectively on the data lines, and means for forcibly setting the output potentials of the sense amplifiers at a predetermined potential. According to one feature of the present invention, upon effecting initial set, all the address lines are simultaneously energized and the output potentials of all the sense amplifiers are brought to the predetermined potential, whereby the memory contents of all the memory cells can be brought into a predetermined initial condition. According to another feature of the present invention, the memory cells can be brought into the initial condition in sequence for the successive groups of memory cells associated with the respective address lines, by successively and continuously energizing the respective address lines while continuously maintaining the output potentials of all the sense amplifiers at the predetermined potential.

In the present invention, the initial set is not limited to the setting of the contents of all the memory cells within a memory into the sense condition, but it is also possible to group the memory cells and write the same memory content for each group. For instance, in the case where two arrays of memory cells are present, it is possible to set all the memory cells in one array into a logic "0" state and all the memory cells in the other array into a logic "1" state.

Figure 3:
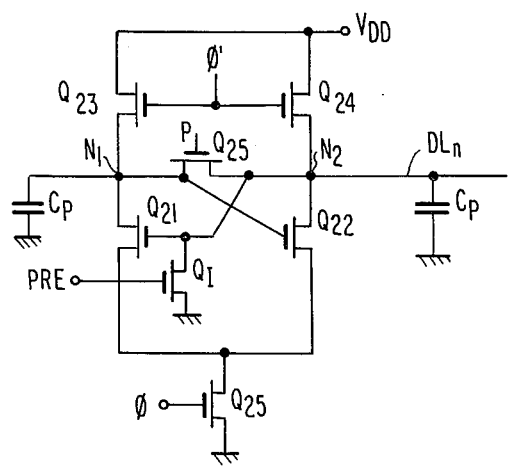
Figure 2:
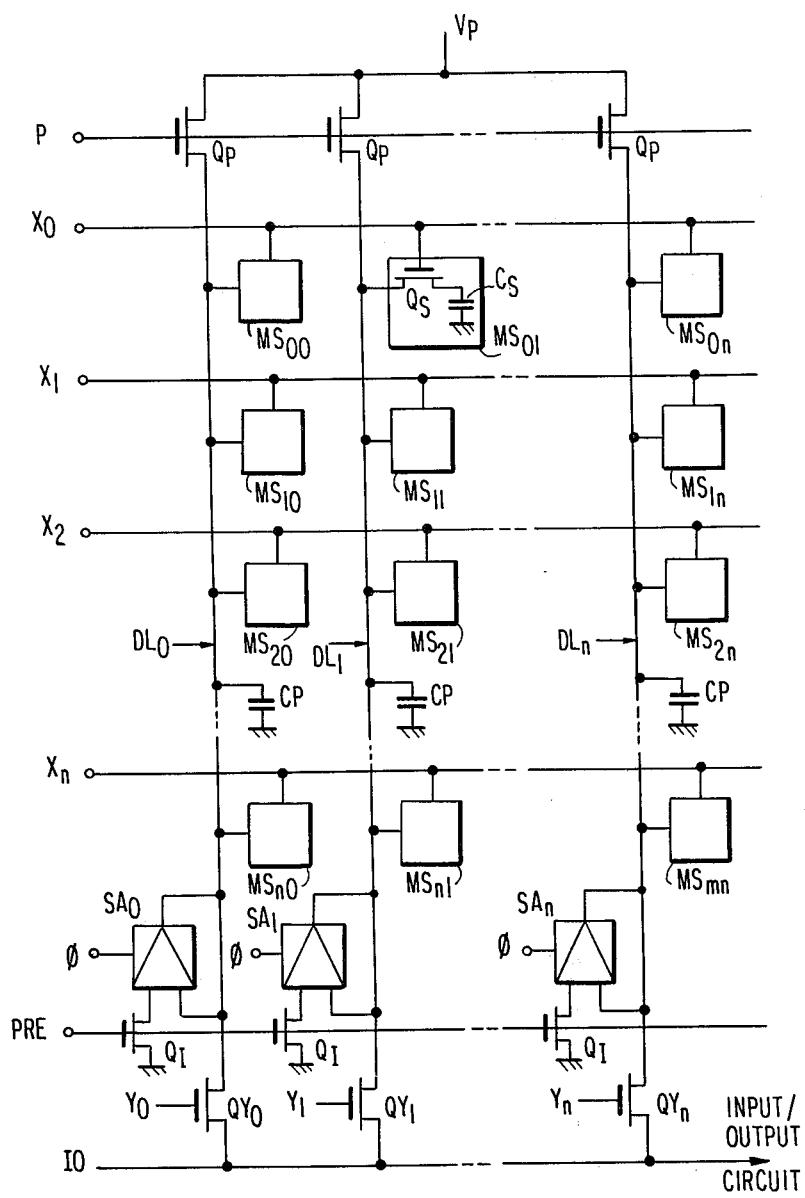
Figure 4:
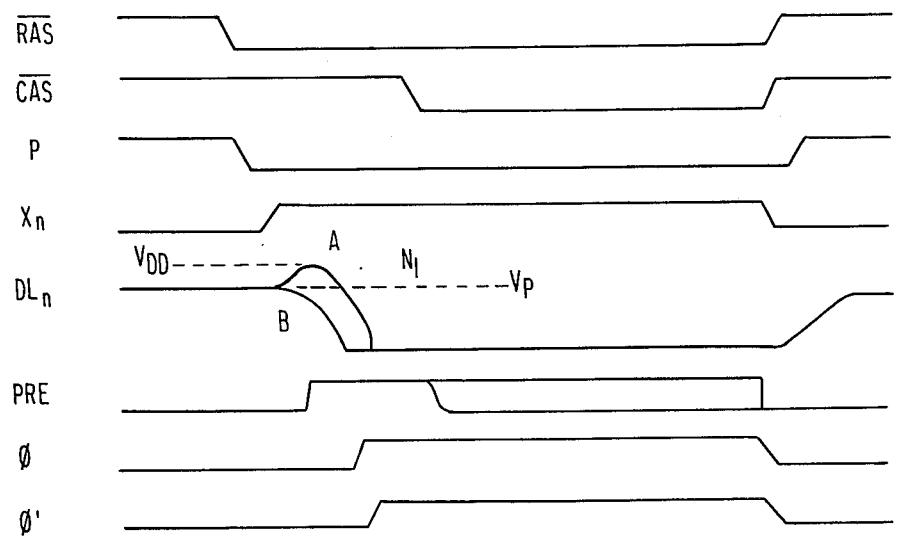
Figure 5:
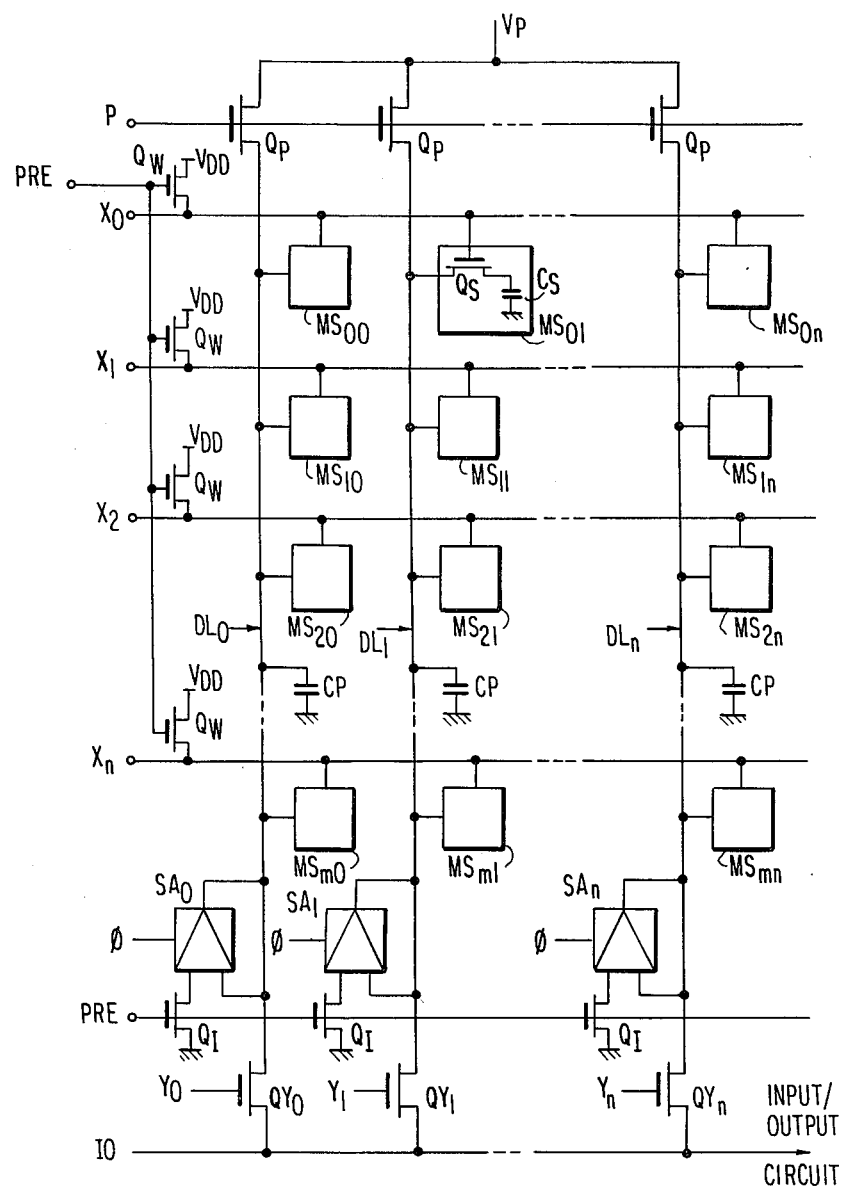
Figure 7A:
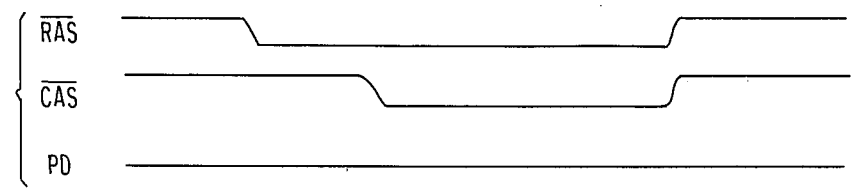
Figure 7B:
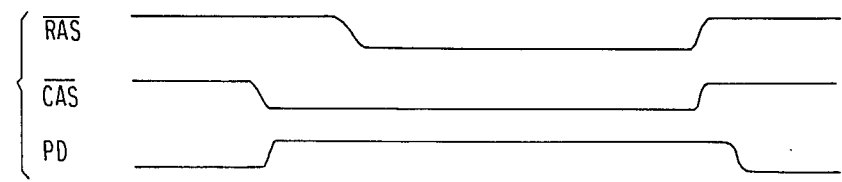

The above-mentioned and other objects, features and advantages of the present invention will become more apparent by reference to the following description of preferred embodiments of the invention taken in conjunction with the accompanying drawings, wherein:

FIG. 1 is a schematic circuit diagram of a known MOS-type one-transistor-cell dynamic memory, FIG. 2 is a schematic circuit diagram illustrating one preferred embodiment of the present invention as applied to a MOS-type one-transistor-cell dynamic memory, FIG. 3 is a circuit diagram showing a construction of a sense amplifier in the preferred embodiment shown in FIG. 2, FIG. 4 is a timing chart showing the mode of operation in the embodiment illustrated in FIG. 2, FIG. 5 is a schematic circuit diagram illustrating another preferred embodiment of the present invention, FIG. 6 is a block diagram showing the mode of initial set control according to the present invention, FIGS. 7A and 7B are timing charts to be used for explaining the operation of the circuit shown in FIG. 6, and FIG. 8 is a circuit diagram showing still another preferred embodiment of the present invention.

In the following, description will be made, by way of example, on a basic operation of a dynamic memory employing MOS-type one-transistor memory cells as well as the present invention applied to such dynamic memory.

A basic structure of a dynamic memory employing MOS-type one-transistor memory cells is illustrated in FIG. 1. Holding of data in a dynamic memory is effected by making the condition of a capacitor $C_s$ in each memory cell $MS_{ij}$ (i=o~m, j=o~n), that is whether it is charged or discharged, correspond to logic "0" or logic "1". In the following description, a principle of read and write will be explained on the assumption that the charged condition corresponds to logic "1" and the discharge condition corresonds to logic "0". Write of data to or read of data from a memory cell $MS_{ij}$ driven by a data line $DL_j$ and a row selection line $X_i$ is effected via a transistor $Q_s$ to or from a capacitor $C_s$. In the beginning of a write or read operation, transistors $Q_p$ are driven by a precharge signal P for charging line capacitors $C_p$ associated with the respective data line $DL_j$, and after the potential on these line capacitors $C_p$ has been raised up to a voltage $V_p$, the transistors $Q_p$ are turned off.

Under the above-mentioned condition, after logic "0" (the ground potential) has been applied to an input/output line IO as write data, if one of column selection lines $Y_j$, for instance, $Y_1$ is selected. Then a transistor $Q_{Y1}$ is driven, and only the line capacitor $C_p$ associated with a data line $DL_1$ is discharged and brought to the ground potential. After the transistor $Q_{Y1}$ is turned off by making the column selection line $Y_1$ unselected, if one of row selection lines $X_i$, for instance, $X_o$ is selected, then transistor $Q_s$ in memory cells $MO_{oj}$ (j=o~n) are driven through the row selection line $X_o$, and the date lines $DL_j$ are respectively connected to capacitors $C_s$ in the memory cells $MS_{oj}$. At this moment, since the line capacitor $C_p$ associated with the data line $DL_1$ has been already discharged and brought to the ground potential, if the capacitor $C_s$ in the memory cell $MS_{01}$ is in a charged condition, then the charge on the capacitor $C_s$ will quickly discharge towards the line capacitor $C_p$ associated with the data line $DL_1$ and the potential of the capacitor $C_s$ will fall. The data lines $DL_j$ other than the data line $DL_1$ will change in potential depending upon the charged or discharged condition of the capacitors $C_s$ in the memory cells $MO_{oj}$. First, in the case that the capacitor $C_s$ is in a discharged condition, the charge precharged on the capacitor $C_p$ associated with the data lines $DL_j$ is discharged towards the capacitor $C_s$ and the potential of on the capacitor $C_p$ falls from the initial voltage $V_p$ on the data lines $DL_j$. Whereas, in the case that the capacitor $C_s$ is in a charged condition and the potential on the capacitor $C_s$ is higher than the voltage $V_p$, the potential on the data lines $DL_j$ rises further. At this moment, if sense amplifiers $SA_j$(j=o~n) are driven by a sense enable pulse $\phi$, then the potentials on the data lines $DL_j$ are respectively amplified in such manner that a potential on a data line which is falling is brought to the ground potential, while a potential on a data line which is rising is brought to a further high potential, and thereby charging or discharging of the capacitors connected to the respective data lines $DL_j$ is carried out. Thereafter, by making the row selection line $X_o$ unselected and turning off the transistors $Q_s$ in the memory cell $MS_{oj}$, the write operation is terminated.

In the case that logic "1" (a potential higher than the voltage $V_p$) is applied to the input/output line IO as one of write data and the memory cell $MS_{01}$ is in a discharged condition, since the line capacitor $C_p$ associated with the data line $DL_1$ is charged through the input/output line IO and held at a potential higher than the voltage $V_p$, when the row selection line $X_o$ is selected, the capacitor $C_p$ begins to discharge towards the capacitor $C_s$ in the memory cell $MS_{01}$, and the potential on the data line $DL_1$ is amplified by the sense amplifier $SA_1$ at a time point when the potential has not yet fallen to the voltage $V_p$, and it is thereby raised higher than the voltage $V_p$ to write logic "1". In addition, in the other memory cells $MS_{oj}$ in which write is not effected, also the potentials of the stored data are rewritten by the sense amplifiers $SA_j$ and thus refreshed.

With regard to read of the stored data, after the line capacitors $C_p$ associated with the data lines $DL_j$ have been charged, if one of the row selection lines $X_i$, for example, $X_o$ is selected, then the potentials on the capacitors $C_s$ in the memory cells $MS_{oj}$ are respectively read out on the data lines $DL_j$ as described above, and the capacitors $C_s$ in the memory cells $MS_{oj}$ are refreshed by the sense amplifiers $SA_j$. Under the above-mentioned condition, if one of the column selection lines $Y_j$, for instance, $Y_1$ is selected, then the potential on the data line $DL_1$ is read out via the transistor $Q_{Y1}$ onto the input/output line IO.

As described above, write and rear of data into and from the memory cells $MS_{ij}$ are effected via the data lines $DL_j$, and the data on the lines $DL_j$ are amplified by the sense amplifiers $SA_j$ provided on the respective data lines $DL_j$. Accordingly, in order to carry out initial set in such a memory in the prior art, it is necessary to effect the above-described write operations for all the memory cells, and hence it was impossible to carry out initial set at a high speed.

Now one preferred embodiment of the present invention will be explained with reference to FIG. 2. In FIG. 2, additional transistors $Q_I$ are provided for the purpose of forcibly setting output conditions of the respective sence amplifiers $SA_o$ to $SA_n$. In the illustrated example, the transistors $Q_I$ are adapted to respond to an initial set signal PRE for driving the outputs of the sense amplifiers $SA_o$ to $SA_n$, that is, the respective data lines $DL_o$ to $DL_n$ to the ground level. In FIG. 2, after the transistors $Q_I$ have been driven through the preset line PRE, if the sense amplifiers $SA_j$(j=o~n) are driven by a sense enable pulse $\phi$, then the sense amplifiers $SA_j$ determine via the transistors $Q_I$ the output potentials on the data lines $DL_j$, irrespective of the potentials on the data lines $DL_j$ which were read out of the memory cells $MS_{ij}$. Since all the sense amplifiers $SA_j$ are directly and simultaneously controlled, there is no need to connect the input/output line IO to the data lines $DL_j$, and hence it is unnecessary to select the column selection lines $Y_j$. Accordingly, in a dynamic memory, by selecting only the row selection lines $X_i$ sequentially from $X_o$ to $X_n$, all the memory cells $MS_{ij}$ can be subjected to initial set within a short period of time, in sequence for the respective groups of memory cells associated with the successive row lines. Moreover, since operation is returned to the operation in which the sense amplifiers $SA_j$ amplify the potentials on the data lines $DL_j$ similarly to the operation described previously with reference to FIG. 1 under the condition where the transistors $Q_I$ are turned off, a refresh operation can be carried out by turning off the transistors $Q_I$. Accordingly, either a refresh operation or an initial set operation can be easily selected via the preset line PRE. In addition, it will be easily understood that the memory device according to the present invention is very simple in the circuit construction.

It should be noted that in a static memory, although the refresh operation is unnecessary, the initial set can be similarly realized by controlling the sense amplifiers in the above-described manner. When it is desired to set logic "1" (that is, the power supply level $V_{cc}$), it is only necessary to apply the power supply level $V_{cc}$ through the transistor $Q_I$, and if necessary, switching means for optionally selecting either the ground potential or the power supply potential could be provided.

In FIG. 3 is shown one example of the sense amplifier $SA_n$ provided with the transistor $Q_I$. In this circuit arrangement, gates and drains of MOS transistors $Q_{21}$ and $Q_{22}$ are cross-connected at nodes $N_1$ and $N_2$, and the sources of these transistors are connected in common and the junction is grounded via a transistor $Q_{25}$. Transistors $Q_{23}$ and $Q_{24}$ operate as loads for the transistors $Q_{21}$ and $Q_{22}$, and upon precharge the transistor $Q_{25}$ conducts to equalize the levels at the nodes $N_1$ and $N_2$.

Now the operation of the above-described embodiment will be described with reference to FIG. 4. Here, by way of example, description will be made on a memory employing an address signal introduction system according to the multi-strobe system. In a multi-strobe system, a row selection address is introduced in synchronism with a Row Address Strobe signal ($\overline{RAS}$) and a data line address is introduced in synchronism with a Column Address Strobe signal ($\overline{CAS}$).

At first, when the $\overline{RAS}$ is at a high level, a precharge signal P presents a high level, and so, the nodes $N_1$ and $N_2$ and a data line $DL_n$ are charged. When the RAS changes to a low level to introduce active period, the precharge signal P takes a low level, a row selection line $X_n$ is selected and an initial set signal PRE rises, so that a transistor $Q_I$ becomes conducting. At this moment, the level on the data line $DL_n$ transfers either as shown by curve A when the accessed cell holds logic "1" or as shown by curve B when the accessed cell holds logic "0". Consequently, the node $N_2$ transfers to the ground level. Subsequently, in response to a sense enable signal $\phi$, the transistor $Q_{21}$ is turned off and the transistor $Q_{22}$ is turned on because of the conducting state of the transistor $Q_I$, thus the data line $DL_n$ is driven to a low level without write data, and thereby write of a low level to memory cells connected to the data line $DL_n$ is effected.

Now another preferred embodiment of the present invention will be described with reference to FIG. 5. In this preferred embodiment, transistors $Q_w$ are additionally provided for the respective row selection lines $X_o \sim X_n$ in the first preferred embodiment shown in FIG. 2, and these transistors $Q_w$ are driven by a signal PRE' which is activated somewhat earlier than the initial set signal PRE. In this preferred embodiment, since all the row selection lines $X_o \sim X_n$ are simultaneously energized, initial set can be finished at the same time for all the memory cells.

In the following, the initial set signals PRE and PRE' in the above-described multi-strobe system will be explained jointly with the entire construction of the memory with reference to FIGS. 6 and 7A and 7B.

In a multi-strobe system employing the $\overline{RAS}$ and the $\overline{CAS}$ as control signals, upon normal access at first a refresh address is introduced by the $\overline{RAS}$ being brought to a low active level, and then a data line address in introduced by the $\overline{CAS}$ being brought to a low active level as shown in FIG. 7(A). In this way, in the conventional multi-strobe system it is the base of operation that the $\overline{RAS}$ is first made active and then the $\overline{CAS}$ is made active. Accordingly, in the case of such multi-strobe system, the initial set operation can be instructed without increasing external terminals of the memory at all by first bringing the $\overline{CAS}$ to a low level and then bringing the $\overline{RAS}$ to a low level as shown in FIG. 7(B) on the contrary to the normal operation. In the circuit shown in FIG. 6, to that end there is provided an initializing operation switching circuit 63 which receives the $\overline{RAS}$ and the $\overline{CAS}$ and switches to an initial set operation when it detects that these $\overline{RAS}$ and $\overline{CAS}$ are introduced in the sequence illustrated in FIG. 7(B). This switching circuit 63 generates a detection signal PD when the $\overline{CAS}$ takes a low active level while the $\overline{RAS}$ is held at a high level. The signal PD is applied to a write circuit 68 and a rear circuit 69 to inhibit their operations. On the other hand, the same detection signal PD is applied to a $\overline{RAS}$ timing generator circuit 61 to drive this circuit for generating the respective drive signals P, PRE, PRE', $\phi$, etc. These drive signals are applied to a cell matrix 66 and a sense amplifier section 67 to drive the circuit structure shown in FIG. 2 or 5, and thereby initial set can be achieved.

Now still another preferred embodiment of the present invention will be described with reference to FIG. 8. In this preferred embodiment, data lines DL and $\overline{DL}$ are respectively connected to a pair of input/output points $N_1$ and $N_2$ of a sense amplifier SA. To the data line $\overline{DL}$ are connected memory cells MC' which form a cell array $A_2$, and to the data line DL are connected memory cells MC which form a cell array $A_1$. The respective data lines DL and $\overline{DL}$ are connected via data line selection transistors $Q_{Y1}$ and $\overline{Q_{Y1}}$ to input/output buses I/O and $\overline{I/O}$, respectively. Here it is defined that read data "1" is represented by "1" on the bus I/O and "0" on the bus $\overline{I/O}$, while the read data "0" is represented by "0" on the bus I/O and "1" on the bus $\overline{I/O}$. In this case, the data "0" corresponds to a discharged condition of a capacitor $C_s$ in a memory cell of the cell array $A_1$ and a charged condition of a capacitor $C_s$ in a memory cell of the cell array $A_2$ in combination. Accordingly, assuming that the initial set is carried out by bringing the memory contents of the memory cells to "0" as viewed on the rear data side, then it is only necessary to forcibly bring the node $N_2$ of the sense amplifier SA to the ground level. Therefore, an initial set transistor $Q_I$ is provided between the node $N_2$ and the ground and it is made to conduct by the signal PRE upon an initial set operation. The initial set signal PRE is also applied to X-decoders 81 and 82 so as to activate all the address lines $X_o \sim X_3$. While only a circuit construction associated with one sense amplifier SA is illustrated in FIG. 8, it is a matter of course that the remaining portion of the memory is also constructed in a similar manner. In this preferred embodiment, after the data lines DL and $\overline{DL}$ have been precharged in response to the precharge signal P, in response to the initial set signal PRE the respective row selection lines $X_0 \sim X_3$ are activated and the transistors $Q_I$ are made to conduct. Thereby the node $N_2$ transfers to a low level, while the other node $N_1$ is held at the precharge level. Subsequently, in response to the latch signal $\phi$, the sense amplifier SA is driven, so that a transistor $Q_{82}$ becomes conducting and a transistor $Q_{81}$ becomes non-conducting. Then, in response to the signal $\phi'$, the load transistors are driven and thereby a high level is established on the data line $\overline{DL}$ and a low level is established on the data line DL. In this way, the capacitors in the memory cells in the cell area $A_2$ are brought to a charged condition, while the capacitors in the memory cells in the cell area $A_1$ are brought to a discharged condition, and thereby the initial set can be achieved.

I claim:

1. A memory device comprising a plurality of address lines, a plurality of data lines intersecting with said address lines, a plurality of memory cells disposed at the intersections of said address lines and said data lines, a plurality of sense amplifiers each having an output terminal, a plurality of connection means each for connecting the output terminal of one of said sense amplifier to the associated data line, means for receiving a row strobe signal, means for receiving a column strobe signal, means for receiving row address information in response to an active level of said row strobe signal, means for receiving column address information in response to an active level of said column strobe signal, row selection means for selecting said address lines by said row address information, column selection means for selecting said data lines by said column address information, first control means for enabling said row selection means and said column selection means so as to perform normal memory operation when said column strobe signal is made at the active level after said row strobe signal has been made at the active level, a plurality of set means each coupled to the associated sense amplifier for operatively setting the output terminal of said associated sense amplifier at a predetermined potential, said predetermined potential corresponding to one of logic levels to be stored, detection means generating a detection signal when said row strobe signal is made at the active level after said column strobe signal has been set at the active level, and second control means for simultaneously enabling said plurality of set means thereby to make potentials of said data lines at said predetermined potential in response to said detection signal.

2. The memory device according to claim 1, in which said row selection means makes all of said address lines at a selection level in response to said detection signal.

3. The memory device according to claim 1, further comprising a data bus line, a plurality of selection gates each coupled between said data bus line and the associated data line, and means for selectively enabling said selection gate.

4. The memory device according to claim 3, further comprising means for operatively supplying said data bus line with write data.

5. The memory device according to claim 4, further comprising means for disabling said supplying means in response to said detection signal.

6. A memory device comprising a plurality of address lines, a plurality of data lines intersecting with said address line, a plurality of memory cells disposed at the intersections of said address line and said data lines, a plurality of sense amplifiers, each of said sense amplifiers being coupled to the associated data line, a bus line, a plurality of gating means each coupled between said bus line and the associated data line, write means for operatively supplying said bus line with a logic level to be written, a first terminal for receiving a row strobe signal, a second terminal for receiving a column strobe signal, means for receiving row address information in response to an activation of said row strobe signal, means for receiving column address information in response to an activation of said column strobe signal, row selection means for selecting said address lines by said row address information, column selection means for selectively enabling said gating means by said column address information, means for enabling said low selection means and said column selection means when said column strobe signal is activated after the activation of said row strobe signal, means for generating a first control signal when said row strobe signal is activated after the activation of said column strobe signal, a plurality of set means each or operatively making the associated data line at a predetermined potential irrespectively of a potential of said bus line, second control means for simultaneously enbling said plurality of set means in response to said first control signal, and third control means for making all of said address lines at a selection level in response to said first control signal whereby contents of said plurality of memory cells are simultaneously set to the same logic state in response to said first control signal.

7. The memory device according to claim 6, in which said predetermined potential is ground potential.

8. The memory device according to claim 6, further comprising third control means for disenabling said write means when said first control means is enabled.

9. The memory device according to claim 6, further comprising means for operatively enabling said sense amplifiers.

10. The memory device according to claim 6, in which each of set means includes a field effect transistor coupled between the associated data line and source of said predetermined potential.

11. A memory device comprising a plurality of data line pairs, each of said data line pairs including a first data line and a second data line, a plurality of first address lines intersecting with said first data lines, a plurality of second address line intersecting with said second data lines, a plurality of first memory cells disposed at intersections of said first data lines and said first address lines, a plurality of second memory cells disposed at intersections of said second data lines and said second address lines, a plurality of sense amplifiers each having a first and a second input node, a plurality of first means each for connecting the first input node of one of said sense amplifiers to the associated first data line, a plurality of second means each for connecting the second input node of one of said sense amplifiers to the associated second data line, means for receiving a row strobe signal, means for receiving a column strobe signal, means for selecting at least one of said memory cells under control of said row strobe signal and said column strobe signal when said column strobe signal is activated after an activation of said row strobe signal, means for generating a control signal when said row strobe signal is activated after an activation of said column strobe signal, a plurality of set means each coupled to the first input node of the associated sense amplifier for operatively setting said first input node at a first logic level in response to said control signal, and means for enabling said sense amplifiers after said set means are enabled thereby to make said first input nodes and said second input nodes at said first logic level and at a second opposite logic level respectively.

12. The memory device according to claim 11, further comprising a first bus line, a second bus line, and a plurality of selection gate pairs, each of said selection gate pairs including a first selection gate coupled between said first bus line and the associated first data line and a second selection gate coupled between said second bus line and the associated second data line.

13. A memory device comprising a first data line, a second data line, a plurality of address lines intersecting with said data lines, a plurality of memory cells, a first node, a second node, a third node, means for connecting said first node to said first data line, means for connecting said second node to said second data line, a first terminal for receiving a row strobe signal, a second terminal for receiving a column strobe signal, means for selecting said address lines under control of said row strobe signal, an output terminal, column selection means for selectively transmitting information on at least one of said first and second data lines to said output terminal under control of said column strobe signal, means for enabling said row selection means and column selection means when said column strobe signal is activated after the activation of said row strobe signal, means for generating a control signal when said row strobe signal is activated after the activation of said column strobe signal, a first insulated gate field effect transistor having a drain coupled to said first node, a gate coupled to said second node and a source coupled to said third node, a second insulated gate field effect transistor having a drain coupled to said second node a gate coupled to said first node and a source coupled to said third node, means for operatively supplying said third node with a reference potential, a third insulated gate field effect transistor having a drain coupled to said first node and a source supplied with said reference potential, means for operatively conducting said third transistor in response to said control signal, and means for enabling said means for supplying said third node with a reference potential after said third transistor is made conducting.

14. The memory device according to claim 13, in which said reference potential is ground potential.

* * * * *

UNITED STATES PATENT AND TRADEMARK OFFICE
CERTIFICATE OF CORRECTION

PATENT NO. : 4,439,843
DATED      : March 27, 1984
INVENTOR(S) : Ryoichi Takamatsu It is certified that error appears in the above-identified patent and that said Letters Patent is hereby corrected as shown below:

Column 2, line 52, change "corresonds" to --corresponds--

Column 3, line 64, change "rear" to --read--

Column 4, line 9, change "sence" to --sense--

Column 5, line 1, change "RAS" to --$\overline{RAS}$--

Column 5, line 34, change "in" to --is--

Column 5, line 53, change "rear" to --read--

Column 6, line 13, change "rear" to --read--

Column 7, line 38, change "low" to --row--

Column 7, line 44, change "or" to --for--

Signed and Sealed this

Twenty-sixth Day of March 1985

[SEAL]

Attest:

DONALD J. QUIGG

Attesting Officer

Acting Commissioner of Patents and Trademarks